(12) United States Patent
Yan et al.

(10) Patent No.: US 11,139,355 B2
(45) Date of Patent: Oct. 5, 2021

(54) DISPLAY PANEL HAVING STRESS RELEASING STRUCTURE AND METHOD FOR MANUFACTURING SAME

(71) Applicant: WUHAN CHINA STAR OPTOELECTRONICS SEMICONDUCTOR DISPLAY TECHNOLOGY CO., LTD., Wuhan (CN)

(72) Inventors: Bo Yan, Wuhan (CN); Jun Cao, Wuhan (CN); Jiangjiang Jin, Wuhan (CN)

(*) Notice: Subject to any disclaimer, the term of this patent is extended or adjusted under 35 U.S.C. 154(b) by 334 days.

(21) Appl. No.: 16/326,372

(22) PCT Filed: Feb. 14, 2019

(86) PCT No.: PCT/CN2019/075031
§ 371 (c)(1),
(2) Date: Feb. 19, 2019

(87) PCT Pub. No.: WO2020/133640
PCT Pub. Date: Jul. 2, 2020

(65) Prior Publication Data
US 2021/0159290 A1    May 27, 2021

(30) Foreign Application Priority Data

Dec. 24, 2018 (CN) .......................... 201811582355.0

(51) Int. Cl.
*H01L 27/32* (2006.01)
*H01L 51/56* (2006.01)
*H01L 51/00* (2006.01)

(52) U.S. Cl.
CPC ...... *H01L 27/3258* (2013.01); *H01L 27/3246* (2013.01); *H01L 51/56* (2013.01);
(Continued)

(58) Field of Classification Search
CPC . H01L 27/3258; H01L 27/3246; H01L 51/56; H01L 51/0097; H01L 2227/323; H01L 2251/5338
(Continued)

(56) References Cited

U.S. PATENT DOCUMENTS

2007/0205719 A1* 9/2007 Kim .................... H01L 51/56
                                                    313/512
2013/0299789 A1* 11/2013 Yamazaki ............ H01L 27/322
                                                    257/40
(Continued)

FOREIGN PATENT DOCUMENTS

| CN | 106252380 A | 12/2016 |
| CN | 107706220 A | 2/2018 |
| CN | 108598135 A | 9/2018 |

OTHER PUBLICATIONS

English Machine Translation of CN 10625380 (Year: 2016).*
English Machine Translation of CN 108598135 (Year: 2018).*

*Primary Examiner* — Dzung Tran

(57) ABSTRACT

The present disclosure provides a display panel having a stress releasing structure and a method for manufacturing the same. The display panel having a stress releasing structure includes a substrate having a display area, a bending area, and a peripheral area, wherein the bending area is positioned between the display area and the peripheral area; a metal wiring disposed on the substrate and extending from the display area to the peripheral area; a planarization layer positioned in the bending area and disposed on the metal wiring; and a pixel defining layer positioned in the bending area and disposed on the planarization layer; wherein at least one of the planarization layer and the pixel defining layer includes a plurality of semi-columns parallel to each other.

12 Claims, 5 Drawing Sheets

(52) U.S. Cl.
CPC .... *H01L 51/0097* (2013.01); *H01L 2227/323* (2013.01); *H01L 2251/5338* (2013.01)

(58) Field of Classification Search
USPC .......................................................... 257/40
See application file for complete search history.

(56) References Cited

U.S. PATENT DOCUMENTS

| | | | |
|---|---|---|---|
| 2016/0066409 A1* | 3/2016 | Kwon | H01L 23/562 |
| | | | 174/254 |
| 2017/0084883 A1* | 3/2017 | Kwon | H01L 27/3244 |
| 2017/0110526 A1* | 4/2017 | Eo | H01L 27/3258 |
| 2017/0117502 A1* | 4/2017 | Park | H01L 51/56 |

\* cited by examiner

DISPLAY PANEL HAVING STRESS RELEASING STRUCTURE AND METHOD FOR MANUFACTURING SAME

FIELD OF INVENTION

The present disclosure relates to a field of display technology, and more particularly to a display panel having a stress releasing structure and a method for manufacturing same.

BACKGROUND

Organic light emitting diode (OLED) displays have advantages such as wide viewing angles, high contrast, and short response times, therefore research and develop of OLED displays attracts manufacturers' attention.

OLED display panels include OLED devices, driver integrated circuits (driver ICs), and metal wirings connected therebetween. OLED devices are positioned in a display area of display panels, driver ICs are positioned in peripheral area of display panels, and metal wirings extend from display area to peripheral area for connecting OLED devices to driver ICs.

Generally, to reduce edge frame widths of display panels, the portion of panels where driver ICs are positioned is bent to a backside of the panels to be in the rear of OLED devices. The area that is bent is, namely, a bending area of display panels. Bending area of display panels includes flexible substrate, through-hole filled by organic material (i.e., organic deep hole, ODH), metal wiring, planarization layer, pixel defining layer, and photo spacer layer. However, during bending process for manufacturing display panels, stress accumulates in metal wirings, and metal wirings are easy to be ruptured during bending process, thus reducing reliability and manufacturing yield of produced display panels.

Accordingly, there is a need to provide a display panel having a stress releasing structure and a method for manufacturing same, so as to solve the problems existing in prior art.

SUMMARY OF DISCLOSURE

Technical Problems

The present disclosure provides a display panel having a stress releasing structure and a method for manufacturing same in order to solve the problems encountered by the prior art, where metal wirings are easy to be ruptured, and manufacturing yield of display panels is low.

Technical Solutions

To solve the aforementioned problems, the present disclosure provides a display panel having a stress releasing structure, comprising:

a substrate having a display area, a bending area, and a peripheral area, wherein the bending area is positioned between the display area and the peripheral area;

a metal wiring disposed on the substrate and extending from the display area to the peripheral area;

a planarization layer positioned in the bending area and disposed on the metal wiring; and a pixel defining layer positioned in the bending area and disposed on the planarization layer;

wherein at least one of the planarization layer and the pixel defining layer includes a plurality of semicircular-columns parallel to each other.

According to one preferred embodiment of the present disclosure, a driver integrated circuit (driver IC) is positioned in the peripheral area, an organic light emitting diode (OLED) device is positioned in the display area, and the metal wiring connects the driver IC and the OLED device.

According to one preferred embodiment of the present disclosure, both the planarization layer and the pixel defining layer include the semicircular-columns parallel to each other, and the semicircular-columns constituting the planarization layer and the semicircular-columns constituting the pixel defining layer have a same extending direction and are arranged to have a staggered relationship.

According to one preferred embodiment of the present disclosure, both the planarization layer and the pixel defining layer include the semicircular-columns parallel to each other, the semicircular-columns constituting the planarization layer and the semicircular-columns constituting the pixel defining layer have different extending directions, and an angle exists between the extending direction of the semicircular-columns constituting the planarization layer and the extending direction of the semicircular-columns constituting the pixel defining layer.

According to one preferred embodiment of the present disclosure, the planarization layer includes the semicircular-columns parallel to each other, and the pixel defining layer includes a continuous flat sheet.

According to one preferred embodiment of the present disclosure, the display panel having the stress releasing structure further comprises:

a photo spacer layer positioned in the bending area and disposed on the pixel defining layer.

According to one preferred embodiment of the present disclosure, all the planarization layer, the pixel defining layer, and the photo spacer layer are made of polyimide.

According to one preferred embodiment of the present disclosure, the substrate includes a through-hole filled by an organic material, and a polyimide material fills the through-hole.

The present disclosure further provides a method for manufacturing a display panel having a stress releasing structure, comprising steps of:

providing a substrate having a display area, a bending area, and a peripheral area, wherein the bending area is positioned between the display area and the peripheral area;

forming a metal wiring on the substrate, wherein the metal wiring extends from the display area to the peripheral area;

forming a planarization layer on the metal wiring, wherein the planarization layer is positioned in the bending area; and forming a pixel defining layer on the planarization layer, wherein the pixel defining layer is positioned in the bending area;

wherein at least one of the planarization layer and the pixel defining layer includes a plurality of semicircular-columns parallel to each other.

According to one preferred embodiment of the present disclosure, both the planarization layer and the pixel defining layer include the semi-circular columns parallel to each other, and the semicircular-columns constituting the planarization layer and the semicircular-columns constituting the pixel defining layer have a same extending direction and are arranged to have a staggered relationship;

both the planarization layer and the pixel defining layer include the semi-circular columns parallel to each other, the semicircular-columns constituting the planarization layer and the semicircular-columns constituting the pixel defining layer have different extending directions, and an angle exists between the extending direction of the semicircular-columns constituting the planarization layer and the extending direction of the semicircular-columns constituting the pixel defining layer; or the planarization layer includes the semicircular-columns parallel to each other, and the pixel defining layer includes a continuous flat sheet.

Advantageous Effects

Compared to prior art, the present disclosure provides a display panel having a stress releasing structure and a method for manufacturing the same. The stress releasing structure is positioned in a bending area of the display panel. The stress releasing structure is formed by forming a planarization layer and a pixel defining layer in the bending area of the display panel, wherein at least one of the planarization layer and the pixel defining layer positioned in the bending area includes a plurality of semicircular-columns parallel to each other. The stress releasing structure can release stress sustained by metal wirings in the bending area. Therefore, the present disclosure solves the problems existing in conventional display panels.

DETAILED DESCRIPTION

Figure 1A:
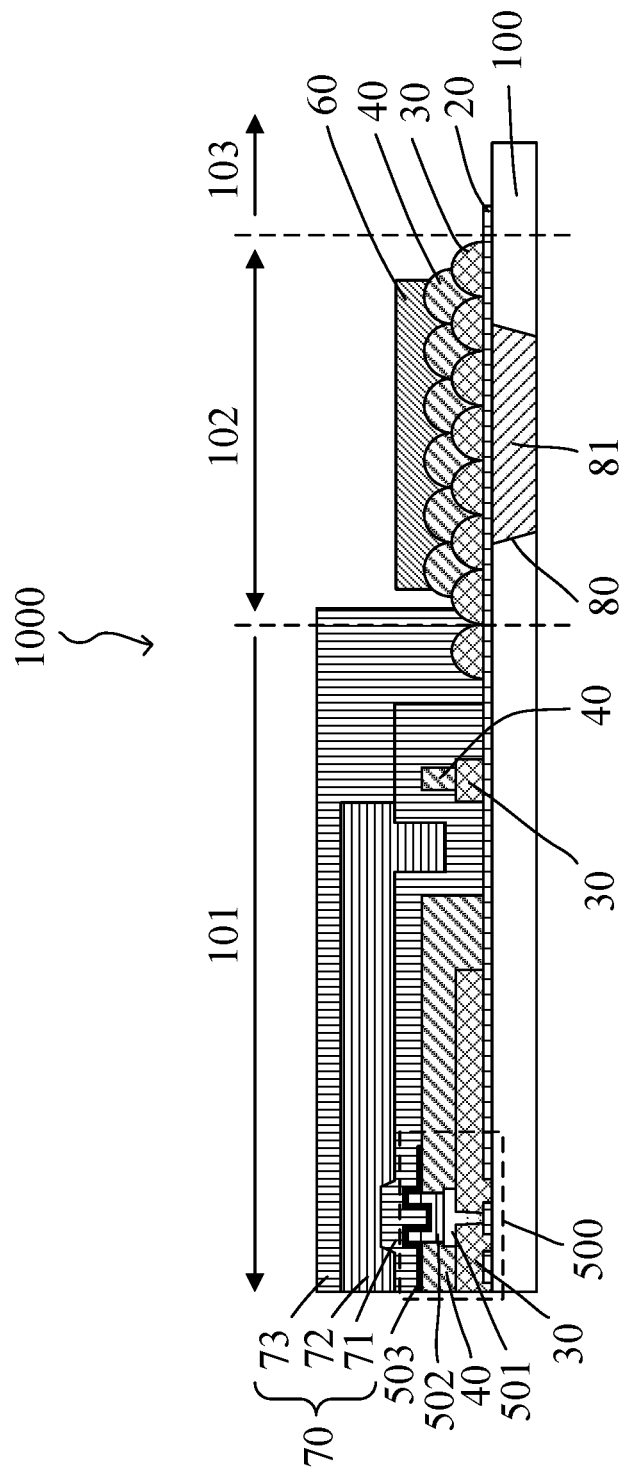
FIG. 1A shows a cross-sectional view of a structure of a display panel having a stress releasing structure manufactured according to EMBODIMENT ONE of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The present disclosure provides a display panel having a stress releasing structure and a method for manufacturing the same. The stress releasing structure is positioned in a bending area of the display panel. The stress releasing structure is formed by forming a planarization layer and a pixel defining layer, wherein at least one of the planarization layer and the pixel defining layer positioned in the bending area includes a plurality of semicircular-columns parallel to each other. As the bending area of the display panels is bent, the stress releasing structure can release stress sustained by metal wirings in the bending area. Therefore, the present disclosure solves the problems existing in conventional display panels.

The present disclosure provides three embodiments, as described in EMBODIMENT ONE, EMBODIMENT TWO, and EMBODIMENT THREE below.

Embodiment One

Figure 1B:
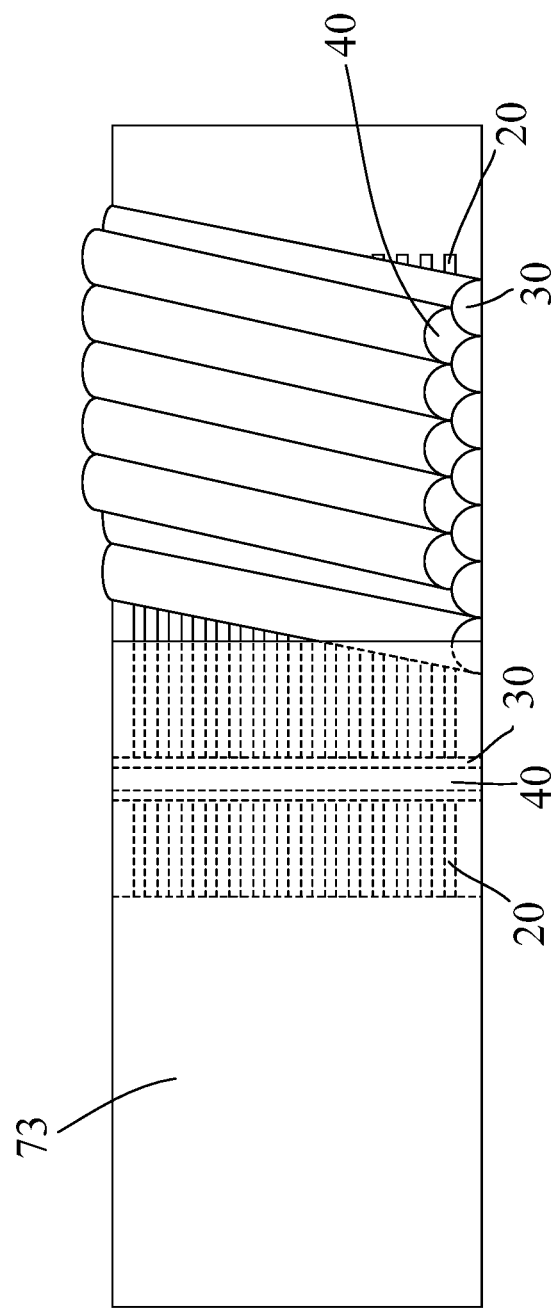
FIG. 1B is a perspective top view of the display panel shown in FIG. 1, wherein the photo spacer layer is omitted for clarity.

Please refer to FIGS. 1A and 1B. FIG. 1A shows a cross-sectional view of a structure of a display panel having a stress releasing structure manufactured according to EMBODIMENT ONE of the present disclosure. FIG. 1B is a perspective top view of the display panel shown in FIG. 1, wherein the photo spacer layer is omitted for clarity.

As shown in FIG. 1A, the present disclosure provides a display panel 1000 having a stress releasing structure, comprising:

a substrate 100 having a display area 101, a bending area 102, and a peripheral area 103, wherein the bending area 102 is positioned between the display area 101 and the peripheral area 103;

a metal wiring 20 disposed on the substrate 100 and extending from the display area 101 to the peripheral area 103;

a planarization layer 30 positioned in the bending area 102 and disposed on the metal wiring 20; and a pixel defining layer 40 positioned in the bending area 102 and disposed on the planarization layer 30.

A driver integrated circuit (driver IC) (not shown) is positioned in the peripheral area 103, an organic light emitting diode (OLED) device 500 is positioned in the display area 101, and the metal wiring 20 connects the driver IC and the OLED device 500. Preferably, the metal wiring 20 and the source/drain electrode (not shown) positioned in the display area 101 are formed at the same time.

The OLED device 500 includes an anode 501, a light-emitting layer 502, and a cathode 503. The pixel defining layer 40 is configured to define pixels in the display area 101.

In addition, an encapsulation layer 70 is positioned in the display area 101. The encapsulation layer 70 includes two organic sub-layers 71 and 73 and one organic sub-layer 72. The encapsulation layer 70 is configured to protect the OLED device 500 from being influenced due to water and oxygen entering thereinto.

As shown in FIG. 1B, in the present EMBODIMENT ONE, both the planarization layer 30 and the pixel defining layer 40 positioned in the bending area 102 include a plurality of semicircular-columns parallel to each other, and the semicircular-columns constituting the planarization layer 30 and the semicircular-columns constituting the pixel defining layer 40 have a same extending direction and are arranged to have a staggered relationship.

The stress releasing structure in the present EMBODIMENT ONE is formed by forming the planarization layer 30 and the pixel defining layer 40 in the bending area 102 of the display panel 1000, wherein both the planarization layer 30 and the pixel defining layer 40 positioned in the bending area 102 include a plurality of semicircular-columns parallel to each other. Thus, even if bending area 102 of the display panel 1000 is bent, and tensile stress generates in the metal wiring 20, both the planarization layer 30 and the pixel defining layer 40 can release stress sustained by the metal wiring 20 in bending area 102.

Moreover, according to the present disclosure, an angle (e.g., ranging from 0° to 90°) between the extending direction of the semicircular-columns and the extending direction of the metal wiring could be adequately adjusted based on different product designs, so as to maximize the function effect of releasing tensile stress.

The planarization layer 30 and the pixel defining layer 40 positioned in the bending area 102 can be formed in the same mask process used for forming the planarization layer 30 and the pixel defining layer 40 positioned in the display area 101 by performing exposure and development treatment. Alternatively, the planarization layer 30 and the pixel defining layer 40 positioned in the bending area 102 can be formed using an imprint technique.

The display panel 1000 having the stress releasing structure further comprises a photo spacer layer 60 positioned in the bending area 102 and disposed on the pixel defining layer 40. The photo spacer layer 60 is configured as a process mask during a vapor deposition process for forming the light-emitting layer 502.

Preferably, all the planarization layer 30, the pixel defining layer 40, and the photo spacer layer 60 are made of polyimide. Preferably, the substrate 100 includes a through-hole (organic deep hole, ODH) 80 filled by an organic material, and a polyimide material 81 fills the through-hole. Polyimide is an organic material. Thus, according to the present disclosure, in addition to the semicircular-columns that function to release stress sustained by the metal wiring, polyimide also can release stress.

Embodiment Two

Figure 2A:
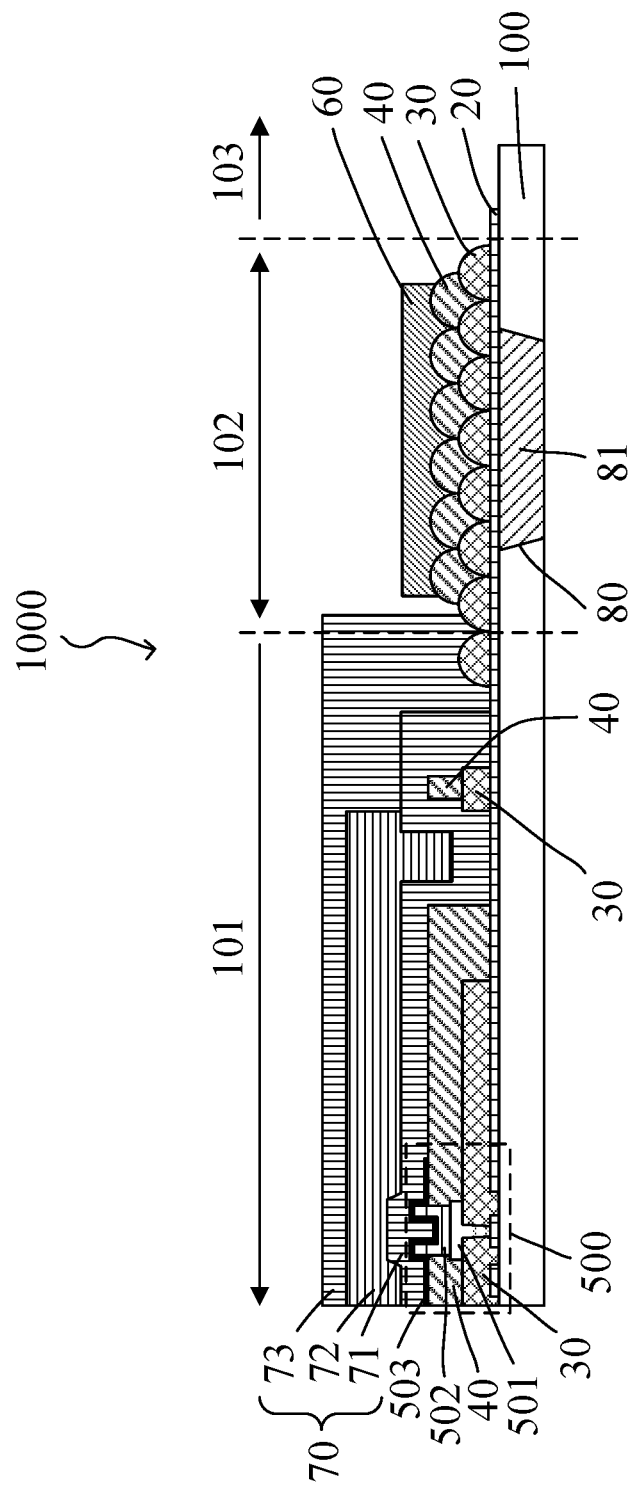
FIG. 2A shows a cross-sectional view of a structure of a display panel having a stress releasing structure manufactured according to EMBODIMENT TWO of the present disclosure.
Figure 2B:
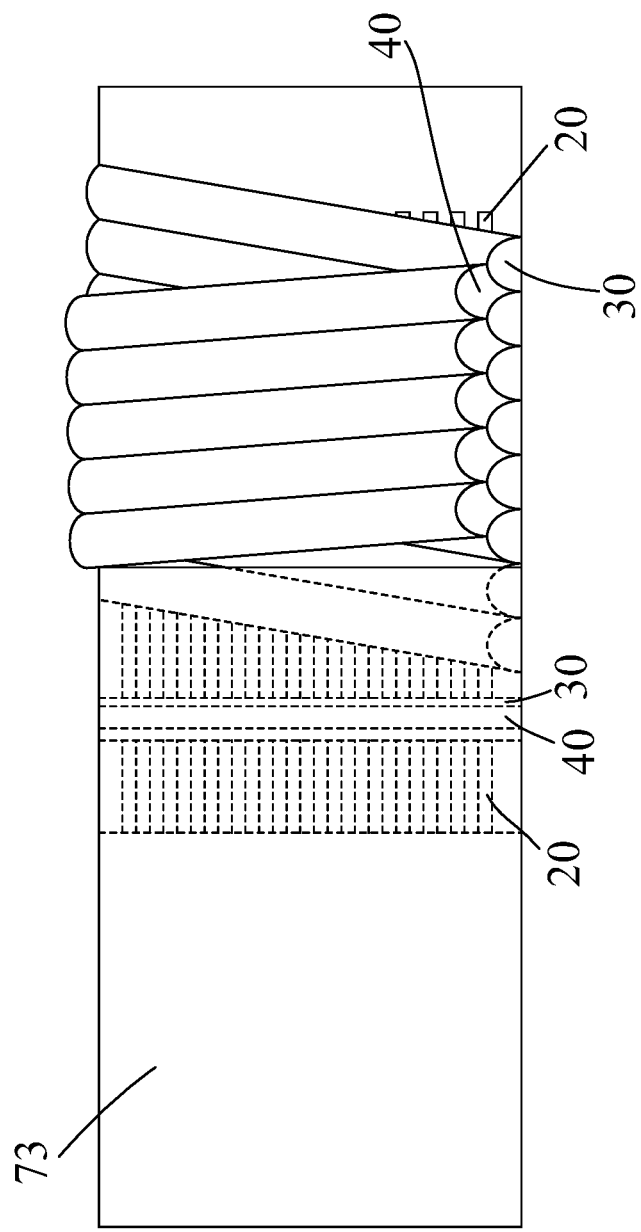
FIG. 2B is a perspective top view of the display panel shown in FIG. 1, wherein the photo spacer layer is omitted for clarity.

Please refer to FIGS. 2A and 2B. FIG. 2A shows a cross-sectional view of a structure of a display panel having a stress releasing structure manufactured according to EMBODIMENT TWO of the present disclosure. FIG. 2B is a perspective top view of the display panel shown in FIG. 1, wherein the photo spacer layer is omitted for clarity.

As shown in FIG. 2B, EMBODIMENT TWO differs from EMBODIMENT ONE in that both the planarization layer 30 and the pixel defining layer 40 include a plurality of semicircular-columns parallel to each other, the semicircular-columns constituting the planarization layer 30 and the semicircular-columns constituting the pixel defining layer 40 have different extending directions, and an angle exists between the extending direction of the semicircular-columns constituting the planarization layer 30 and the extending direction of the semicircular-columns constituting the pixel defining layer 40.

EMBODIMENT TWO is characterized by forming the planarization layer 30 and the pixel defining layer 40 which both include the semicircular-columns parallel to each other in the bending area 102 of the display panel 1000, wherein the semicircular-columns constituting the planarization layer 30 and the semicircular-columns constituting the pixel defining layer 40 have different extending directions, and an angle exists therebetween. The planarization layer 30 and the pixel defining layer 40 function to release stress sustained by the metal wiring 20 in bending area 102 towards different directions.

Embodiment Three

Figure 3:
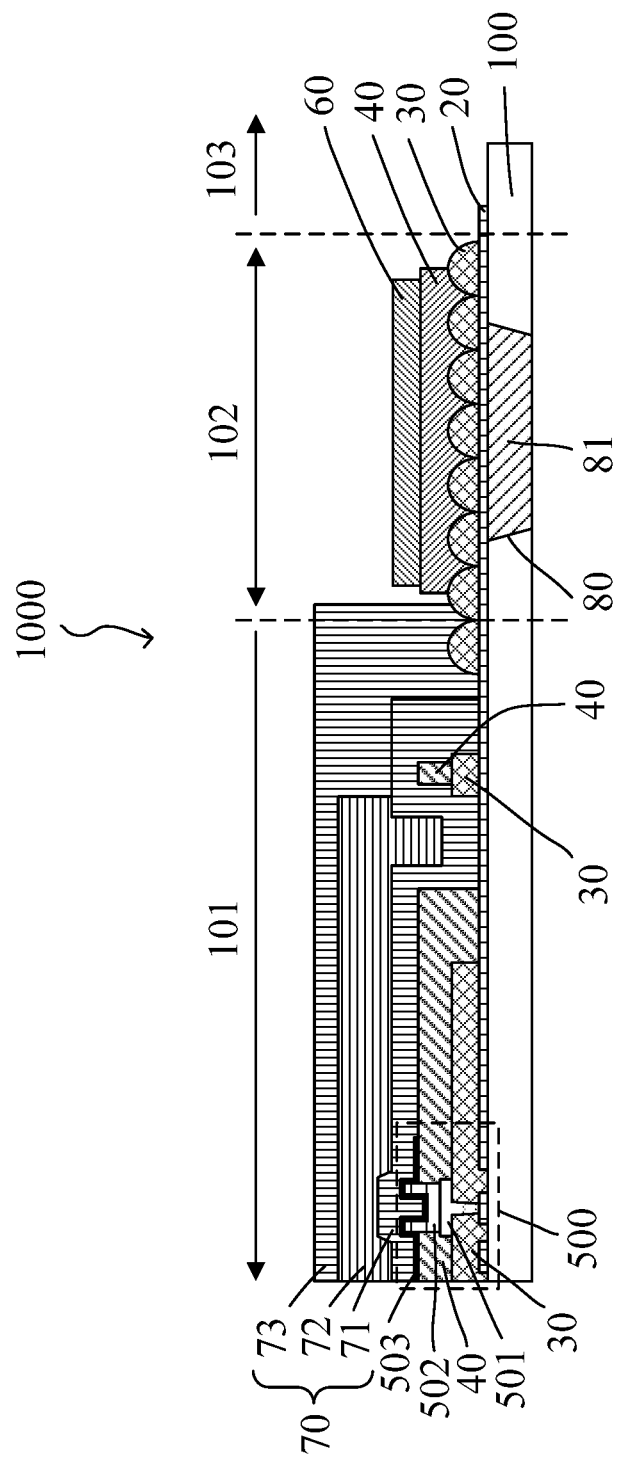
FIG. 3 shows a cross-sectional view of a structure of a display panel having a stress releasing structure manufactured according to EMBODIMENT THREE of the present disclosure.

Please refer to FIG. 3. FIG. 3 shows a cross-sectional view of a structure of a display panel having a stress releasing structure manufactured according to EMBODIMENT THREE of the present disclosure.

As shown in FIG. 3, EMBODIMENT THREE differs from EMBODIMENT ONE in that the planarization layer 30 includes a plurality of semicircular-columns parallel to each other, and the pixel defining layer 40 includes a continuous flat sheet.

Although only the planarization layer 30 includes a plurality of semicircular-columns parallel to each other, while the pixel defining layer 40 includes a continuous flat sheet, the stress releasing structure still can remarkably release stress sustained by the metal wiring.

In addition, the present disclosure further provides a method for manufacturing a display panel 1000 having a stress releasing structure, comprising steps of:

providing a substrate 1000 having a display area 101, a bending area 102, and a peripheral area 103, wherein the bending area 102 is positioned between the display area 101 and the peripheral area 103;

forming a metal wiring 20 on the substrate 100, wherein the metal wiring 20 extends from the display area 101 to the peripheral area 103;

forming a planarization layer 30 on the metal wiring 20, wherein the planarization layer 30 is positioned in the bending area 102; and forming a pixel defining layer 40 on the planarization layer 30, wherein the pixel defining layer 40 is positioned in the bending area 102;

wherein at least one of the planarization layer 30 and the pixel defining layer 40 includes a plurality of semicircular-columns parallel to each other.

The stress releasing structure is formed by forming the planarization layer 30 and the pixel defining layer 40 in the bending area 102 of the display panel 1000, wherein at least one of the planarization layer 30 and the pixel defining layer 40 positioned in the bending area 102 includes a plurality of semicircular-columns parallel to each other. For example, both the planarization layer 30 and the pixel defining layer 40 include a plurality of semicircular-columns parallel to each other, and the semicircular-columns constituting the planarization layer 30 and the semicircular-columns constituting the pixel defining layer 40 have a same extending direction and are arranged to have a staggered relationship. As an alternative, both the planarization layer 30 and the pixel defining layer 40 include a plurality of semicircular-columns parallel to each other, the semicircular-columns constituting the planarization layer 30 and the semicircular-columns constituting the pixel defining layer 40 have different extending directions, and an angle exists between the extending direction of the semicircular-columns constituting the planarization layer 30 and the extending direction of the semicircular-columns constituting the pixel defining layer 40. Also as an alternative, the planarization layer 30 includes a plurality of semicircular-columns parallel to each other, and the pixel defining layer 40 includes a continuous flat sheet.

Compared to prior art, the present disclosure provides a display panel having a stress releasing structure and a method for manufacturing the same. The stress releasing structure is positioned in a bending area of the display panel. The stress releasing structure is formed by forming a planarization layer and a pixel defining layer in the bending area of the display panel, wherein at least one of the planarization layer and the pixel defining layer positioned in the bending area includes a plurality of semicircular-columns parallel to each other. The stress releasing structure can release stress sustained by metal wirings in the bending area. Therefore, the present disclosure solves the problems existing in conventional display panels.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A display panel having a stress releasing structure, comprising:
    a substrate having a display area, a bending area, and a peripheral area, wherein the bending area is positioned between the display area and the peripheral area;
    a metal wiring disposed on the substrate and extending from the display area to the peripheral area;
    a planarization layer positioned in the bending area and disposed on the metal wiring; and
    a pixel defining layer positioned in the bending area and disposed on the planarization layer;
    wherein at least one of the planarization layer and the pixel defining layer includes a plurality of semicircular-columns parallel to each other;
    wherein a driver integrated circuit (driver IC) is positioned in the peripheral area, an organic light emitting diode (OLED) device is positioned in the display area, and the metal wiring connects the driver IC and the OLED device.

2. The display panel having the stress releasing structure according to claim 1, wherein both the planarization layer and the pixel defining layer include the semicircular-columns parallel to each other, and the semicircular-columns constituting the planarization layer and the semicircular-columns constituting the pixel defining layer have a same extending direction and are arranged to have a staggered relationship.

3. The display panel having the stress releasing structure according to claim 1, wherein both the planarization layer and the pixel defining layer include the semicircular-columns parallel to each other, the semicircular-columns constituting the planarization layer and the semicircular-columns constituting the pixel defining layer have different extending directions, and an angle exists between the extending direction of the semicircular-columns constituting the planarization layer and the extending direction of the semicircular-columns constituting the pixel defining layer.

4. The display panel having the stress releasing structure according to claim 1, wherein the planarization layer includes the semicircular-columns parallel to each other, and the pixel defining layer includes a continuous flat sheet.

5. A display panel having a stress releasing structure, comprising:
    a substrate having a display area, a bending area, and a peripheral area, wherein the bending area is positioned between the display area and the peripheral area;
    a metal wiring disposed on the substrate and extending from the display area to the peripheral area;
    a planarization layer positioned in the bending area and disposed on the metal wiring; and
    a pixel defining layer positioned in the bending area and disposed on the planarization layer;
    wherein at least one of the planarization layer and the pixel defining layer includes a plurality of semicircular-columns parallel to each other.

6. The display panel having the stress releasing structure according to claim 5, wherein a driver integrated circuit (driver IC) is positioned in the peripheral area, an organic light emitting diode (OLED) device is positioned in the display area, and the metal wiring connects the driver IC and the OLED device.

7. The display panel having the stress releasing structure according to claim 5, wherein both the planarization layer and the pixel defining layer include the semicircular-columns parallel to each other, and the semicircular-columns constituting the planarization layer and the semicircular-columns constituting the pixel defining layer have a same extending direction and are arranged to have a staggered relationship.

8. The display panel having the stress releasing structure according to claim 5, wherein both the planarization layer and the pixel defining layer include the semicircular-columns parallel to each other, the semicircular-columns constituting the planarization layer and the semicircular-columns constituting the pixel defining layer have different extending directions, and an angle exists between the extending direction of the semicircular-columns constituting the planarization layer and the extending direction of the semicircular-columns constituting the pixel defining layer.

9. The display panel having the stress releasing structure according to claim 5, wherein the planarization layer includes the semicircular-columns parallel to each other, and the pixel defining layer includes a continuous flat sheet.

10. The display panel having the stress releasing structure according to claim 5, wherein the display panel having the stress releasing structure further comprises:
    a photo spacer layer positioned in the bending area and disposed on the pixel defining layer.

11. The display panel having the stress releasing structure according to claim 10, wherein all the planarization layer, the pixel defining layer, and the photo spacer layer are made of polyimide.

12. The display panel having the stress releasing structure according to claim 5, wherein the substrate includes a through-hole filled by an organic material, and a polyimide material fills the through-hole.

* * * * *